United States Patent

Chikawa et al.

[11] Patent Number: 5,506,444
[45] Date of Patent: Apr. 9, 1996

[54] TAPE CARRIER SEMICONDUCTOR DEVICE

[75] Inventors: Yasunori Chikawa, Nara; Yoshiaki Honda, Tenri; Katsunobu Mori; Naoyuki Tajima, both of Nara; Takaaki Tsuda, Tenri; Takamichi Maeda, Ikoma; Mitsuaki Osono, Sakurai, all of Japan

[73] Assignee: Sharp Kabushiki Kaisha, Osaka, Japan

[21] Appl. No.: 212,786

[22] Filed: Mar. 15, 1994

Related U.S. Application Data

[60] Continuation-in-part of Ser. No. 112,315, Aug. 27, 1993, Pat. No. 5,336,650, which is a division of Ser. No. 796,431, Nov. 22, 1991, Pat. No. 5,281,848.

[30] Foreign Application Priority Data

Dec. 11, 1990 [JP] Japan ................... 2-401252
Mar. 17, 1993 [JP] Japan ................... 5-057099

[51] Int. Cl.⁶ ................... H01L 23/495; H01L 23/28
[52] U.S. Cl. ................... 257/666; 257/668; 257/735; 257/787
[58] Field of Search ................... 257/676, 666, 257/667, 668, 787

[56] References Cited

U.S. PATENT DOCUMENTS

| | | |
|---|---|---|
| 4,143,456 | 3/1979 | Inoue et al. . |
| 4,300,153 | 11/1981 | Hayakawa et al. . |
| 4,819,041 | 4/1989 | Redmond . |
| 4,910,582 | 3/1990 | Miyamoto et al. . |
| 4,926,239 | 5/1990 | Fujita et al. . |
| 5,220,196 | 6/1993 | Michii et al. ................... 257/676 |
| 5,281,848 | 1/1994 | Chikawa et al. ................... 257/666 |
| 5,334,858 | 8/1994 | Wada ................... 257/666 |

OTHER PUBLICATIONS

Patent Abstracts of Japan, vol. 10, No. 244, 22 Aug. 1986, and JP-A-61 075 549, 17 Apr. 1986.
Patent Abstracts of Japan, vol. 10, No. 302, 15 Oct. 1986, and JP-A-61 115 342, 2 Jun. 1986.
Patent Abstracts of Japan, vol. 10, No. 244 (E-430)(2300) 22 Aug. 1986 & JP-A-61 075 549 (Toshiba Corp.) Apr. 11, 1986.
Patent Abstracts of Japan, vol. 10, No. 302 (E-445)(2358) 15 Oct. 1986 & JP-A-61 115 342 (Nitto Electric Ind Co) 2 Jun. 1986.

*Primary Examiner*—Sara W. Crane
*Assistant Examiner*—S. V. Clark
*Attorney, Agent, or Firm*—Nixon & Vanderhye

[57] ABSTRACT

In a semiconductor device of a tape carrier package type, the gap width between inner leads connected with a first edge side of a semiconductor chip set within a device mounting hole provided in the tape carrier is larger than the gap width between leads connected with a second edge side opposite to the first edge side of the semiconductor chip, and the gap length of device mounting hole between the first edge of the semiconductor chip and the first edge of the device mounting hole corresponding to the first edge of the semiconductor chip is smaller than the gap length between the second edge of the semiconductor chip and the second edge of the device mounting hole corresponding to the second edge of the semiconductor chip. Such structure enables an encapsulation resin to fill uniformly the device mounting hole, and the encapsulation resin after encapsulation has a shape of a designed dimension.

18 Claims, 8 Drawing Sheets

TAPE CARRIER SEMICONDUCTOR DEVICE

CROSS-REFERENCE TO RELATED APPLICATIONS

This application is a continuation-in part application of U.S. patent applications Ser. No. 08/112,315 filed Aug. 27, 1993, now U.S. Pat. No. 4,336,650 which in turn is a divisional application of U.S. patent application Ser. No. 07/796,431, filed Nov. 22, 1991, now U.S. Pat. No. 5,281,848.

BACKGROUND OF THE INVENTION (i) Field of the Invention

The present invention relates to a tape carrier semiconductor device, and, more particularly, to a tape carrier semiconductor device of a smaller external size capable of higher density mounting of semiconductor devices.

(ii) Description of the Related Art

Heretofore, encapsulation resins for tape carrier semiconductor devices have been selected with priority being given to thinning the thickness of the resin applied to the semiconductor devices. With respect to the viscosity of the resin, liquid resins having a viscosity ranging from 100 to cps are widely used. The device hole size is usually equal to the chip size plus 0.6–1.0 mm. The size of the resulting resin encapsulated area is about the chip size plus 4–5 mm.

A technique capable of controlling the size of the resin encapsulated area to a range of the chip size plus 1–2 mm has not yet been available.

The size of a resin encapsulated area is mostly left to natural phenomena, e.g., after pouring an encapsulation resin, the natural extension of the encapsulation resin is allowed until the natural extension stops.

The viscosity of liquid resins used heretofore is so low that the area covered by the encapsulation resin extends too widely and its size is difficult to control.

Even if the resin viscosity is raised, the encapsulated area can not be controlled to a desired size, and conversely, LSI chips can not be fully covered so that there is a reliability problem.

For the purpose of controlling the size of a resin encapsulated area, there is a method of printing a paste encapsulation resin on the device. Although this method can control the resin encapsulated area at the side of the chip on which the paste encapsulation resin is printed, it is difficult to control the extending area of the encapsulation resin flowing to the opposite side of the chip through a gap between the LSI chip and the device hole.

FIGS. 6A and 6B show a conventional TCP semiconductor device. FIG. 6A is a cross sectional view showing a state after encapsulation with a resin; FIG. 6B is a plan view showing a state before encapsulation with a resin. FIG. 6A is a cross sectional view taken along line B—B of FIG. 6B.

As is clear from FIGS. 6A and 6B, the connections of semiconductor chips mounted on TCP semiconductor devices have become complicated. The number of leads (e.g., electrodes) can vary significantly for each side of the chip.

In other words, formerly electrodes at each side were relatively uniformly arranged. However, recently very non-uniform arrangements have been employed. In addition, as a result of employing a multi-electrode system, the gap width between inner leads is getting narrower and narrower.

The conventional semiconductor device has a semiconductor chip in a device mounting hole 5 formed on a tape carrier 4. The center line 7 of device mounting hole 5 provided in tape carrier 4 coincides with the center line 6 of semiconductor chip 2 regardless of the number of conductor leads 3 connected with electrodes formed on semiconductor chip 2.

In the case of such a semiconductor device, resin encapsulation is usually carried out by dropping or applying a softened sealing resin (such as epoxy resins, silicone resins, polyimide resins and the like) to a front surface side of semiconductor chip 2. The encapsulation resin is thereby applied to the device mounting hole at the surface of semiconductor chip 2 through a region contributing to the outflow of resin. The outflow region is defined by the gap length of the device mounting hole (indicated with $L_1$ and $L_2$ in FIG. 6B) and the lead gap widths (indicated with $W_1$ and $W_2$ in FIG. 6B). The flowability and viscosity properties of the encapsulation resin cause the resin to cover the surface of semiconductor chip 2 and fill the whole device mounting hole 5.

Encapsulation resin 1 becomes a surface protective film for protecting the surface of the semiconductor chip. On the other hand, encapsulation resin 13 and 14 fills the device mounting hole 5 to suppress adverse influences coming from the rear surface and the side surface of semiconductor chip 2 and, in addition, maintains mechanical strength.

First edge side inner leads 33 extending from the first edge 53 of device mounting hole 5 to semiconductor chip 2 are arranged relatively sparsely, i.e. the gap width (W) is large (W=$W_1$). In contrast, second edge side inner leads 34 extending from the second edge 54 opposite to first edge 53 to semiconductor chip 2 are arranged relatively densely, i.e. the gap width (W) is small (W=$W_2$).

For simplification, in FIG. 6B the inner leads 33 at the first edge side are uniformly arranged, and the inner leads 34 at the second edge side are also uniformly arranged.

Designating the lead gap width, the gap length, and the number of lead gaps as W, L and N, respectively, the total area (S) of the regions contributing to the outflow of resin is represented by $S=W \times L \times N$. In the above, for simplification, the regions where the edges contact are excluded.

When the gap length of device mounting hole $L_1$ at the first edge (53) side of device mounting hole 5 is 0.2 mm, the lead gap width $W_1$ of inner leads 33 at the first edge side is 3.0 mm, and the number of lead gaps $N_1$ is 5, the total area $S_1$ of the regions contributing to outflow of resin at the first edge side is $S_1 = L_1 \times W_1 \times N_1 = 0.2 \times 3.0 \times 5 = 3.0 \text{ mm}^2$.

When the gap length of device mounting hole $L_2$ at the side of the second edge 54 of device mounting hole 5 is 0.2 mm, the lead gap width $W_2$ of inner leads 34 at the second edge of the device mounting hole is 0.5 mm, and the number of lead gaps $N_2$ is 11, the total area $S_2$ of the regions contributing to outflow of resin at the second edge side is $S_2 = L_2 \times W_2 \times N_2 = 0.2 \times 0.5 \times 11 = 1.1 \text{ mm}^2$.

That is, the ratio of total area of the regions contributing to the outflow of resin is $S_2/S_1 = 1.1/3.0 = 0.367$.

Since the ratio of $S_2/S_1$ deviates from 1, there is a significant difference in the amount of resin supplied from the resin supplying surface side (the front surface of semiconductor chip 2) to the side surface portion of semiconductor chip 2 between the first edge 53 of device mounting hole 5 (where the arrangement of electrodes is sparse) and the second edge 54 of device mounting hole 5 (where the arrangement of electrodes is dense).

As a result, it is difficult to uniformly flow the encapsulation resin from the resin supplying surface to the side surface of semiconductor chip 2 and to make flat the surface of the resin 1 remaining at the surface to which the resin was applied, i.e. making the thickness of the layer of resin 1 uniform, and therefore, an intended sealing shape of the resin cannot be formed at the designated resin region. Consequentially, stable production is not possible.

In other words, the non-uniform outflow of resin results in forming a portion 13 where the encapsulation resin spreads too broadly and too thin and also a portion 14 where there is a gap due to insufficient supply of the resin. Therefore, the encapsulation becomes imbalanced at the right and the left sides.

As a result, the mechanical strength of the encapsulation cannot be sufficiently ensured. Such imbalance can cause cracks by mechanical stress.

SUMMARY OF THE INVENTION

An object of the present invention is to provide a tape carrier semiconductor device having a resin encapsulated area covering the semiconductor chip which is within an area formed by extending the outer periphery of the semiconductor chip to the outside by 2 mm.

Another object of the present invention is to provide a tape carrier semiconductor device capable of being uniformly encapsulated with an encapsulation resin.

A further object of the present invention is to provide a carrier tape for a semiconductor device which can be used for manufacturing a tape carrier semiconductor device capable of being uniformly encapsulated with an encapsulation resin.

A still another object of the present invention is to provide a process for manufacturing a semiconductor device of a tape carrier package type uniformly encapsulated with a encapsulation resin.

According to a first aspect of the present invention, there is provided a tape carrier semiconductor device which comprises a semiconductor chip in a device hole provided in the tape carrier and sealed by applying an epoxy resin having a viscosity of 500–1200 ps (poises) thereto. The inner periphery of the device hole is within an area defined by the outer periphery of the semiconductor chip and a curve formed by extending the outer periphery of the semiconductor chip to the outside by 0.3 mm.

According to another aspect of the present invention, a tape carrier has a device mounting hole therein that is larger in size than said chip. The chip is disposed within the hole to define a hole-chip gap. A cured epoxy resin fills the hole-chip gap between said chip and the hole and extends beyond the edges of said chip onto the tape carrier. The chip has a differing density of lead connections per unit distance along its edges. A dimension of the hole-chip gap between the chip and the hole along the chip edges is directly related to the density of lead connections thereat.

According to another aspect of the present invention, the chip has a varying number of leads along its edges. A dimension of the hole-chip gap varies along the chip edges as a function of the number of lead connections made thereto.

According to another aspect of the present invention, there is provided a semiconductor device of a tape carrier package type in which a gap width between inner leads connected with a first edge of a semiconductor chip set within a device mounting hole provided in the tape carrier is larger than a gap width between leads connected with a second edge side opposite to the first edge of the semiconductor chip, and a gap length of the device mounting hole between the first edge of the semiconductor chip and a first edge of the device mounting hole corresponding to the first edge of the semiconductor chip is smaller than a gap length between the second edge of the semiconductor chip and a second edge of the device mounting hole corresponding to the second edge of the semiconductor chip.

According to another aspect of the present invention, there is provided a carrier tape for a semiconductor device of a tape carrier package type in which a gap width between inner leads extending from a first edge of a device mounting hole for the semiconductor chip is larger than a gap width between inner leads extending from a second edge of the device mounting hole opposite to the first edge of the semiconductor chip, and a length of the inner lead at the first edge is shorter than that of the inner lead at the second edge.

According to another aspect of the present invention, there is provided a process for manufacturing a semiconductor device.

DESCRIPTION OF THE PREFERRED EMBODIMENTS

FIGS. 1–4 explain a first embodiment of the present invention where an epoxy resin is used for encapsulating a tape carrier semiconductor device.

Figure 1:
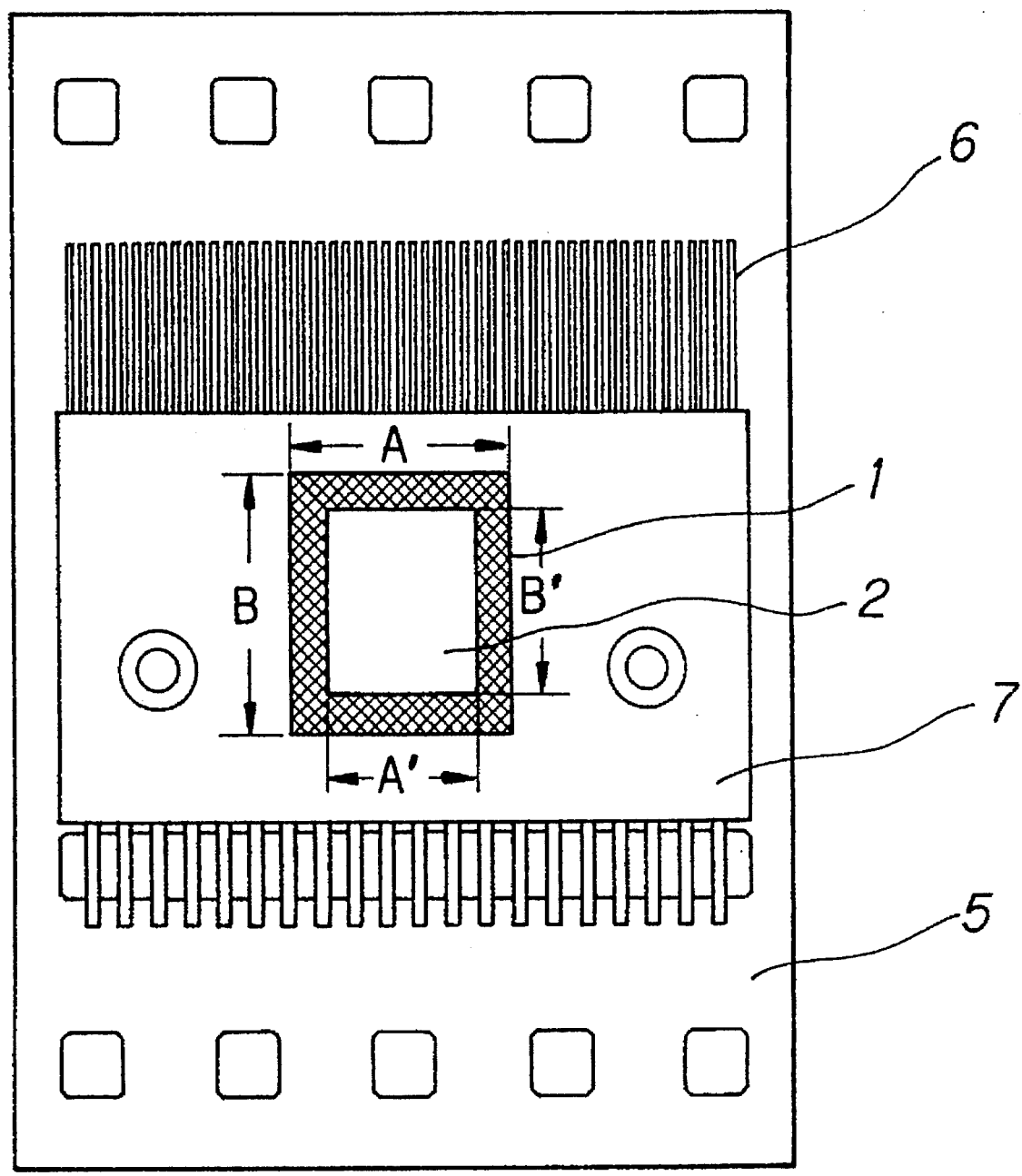
FIG. 1 is a plan view of a tape carrier semiconductor device encapsulated with an epoxy resin according to one embodiment of the present invention.

FIG. 1 illustrates a tape carrier semiconductor device encapsulated with an epoxy resin of the present invention. A lead pattern 6 is provided on a substrate 5 by using an adhesive such as an epoxy resin, and further a solder resist 7, for example, composed of an epoxy resin, is furnished for protecting minute patterns and decreasing connecting resistances.

LSI chip 2 set in a device mounting hole (not shown in FIG. 1, but corresponding to 4 in FIG. 2) is encapsulated with an epoxy resin 1 (crosshatched) having a viscosity of 500–1200 ps.

In FIG. 1, A' and B' represent the transverse and the longitudinal dimensions of LSI chip 2, respectively and A and B represent the transverse and the longitudinal dimension of the resin sealed region, respectively. Each of (A—A')/2, (B—B')/2 and the distance between a vertex of LSI chip 2 and that of the resin encapsulated area corresponding to said vertex of LSI chip 2 is 2 mm or less.

Figure 2:
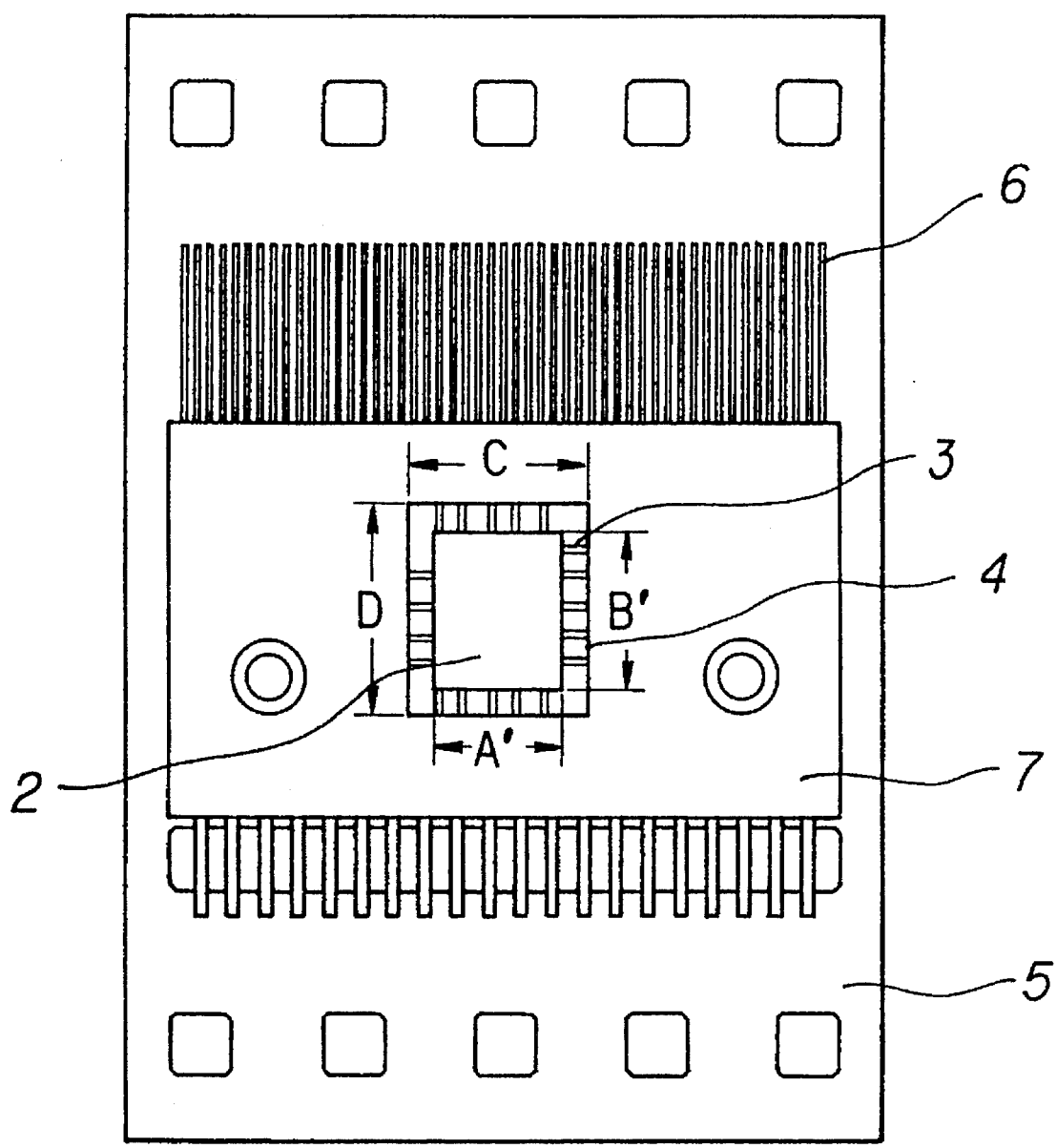
FIG. 2 is a plan view of a tape carrier semiconductor device of the present invention before encapsulated with an epoxy resin.

FIG. 2 shows a tape carrier semiconductor device of FIG. 1 which has not yet been encapsulated with the epoxy resin. In FIG. 1 and FIG. 2, like reference numerals show like parts.

LSI chip 2 is set in device hole 4 and inner leads 3 are connected with LSI chip 2.

In FIG. 2, C and D represent the transverse and the longitudinal dimensions of device hole 4, respectively, and A' and B' represent the transverse and the longitudinal dimensions of LSI chip 2. Each of (C—A')/2, (D—B')/2 and the distance between a vertex of LSI chip 2 and a vertex of device hole 4 corresponding to the vertex of LSI chip 2 is 0.3 mm or less.

Figure 3:
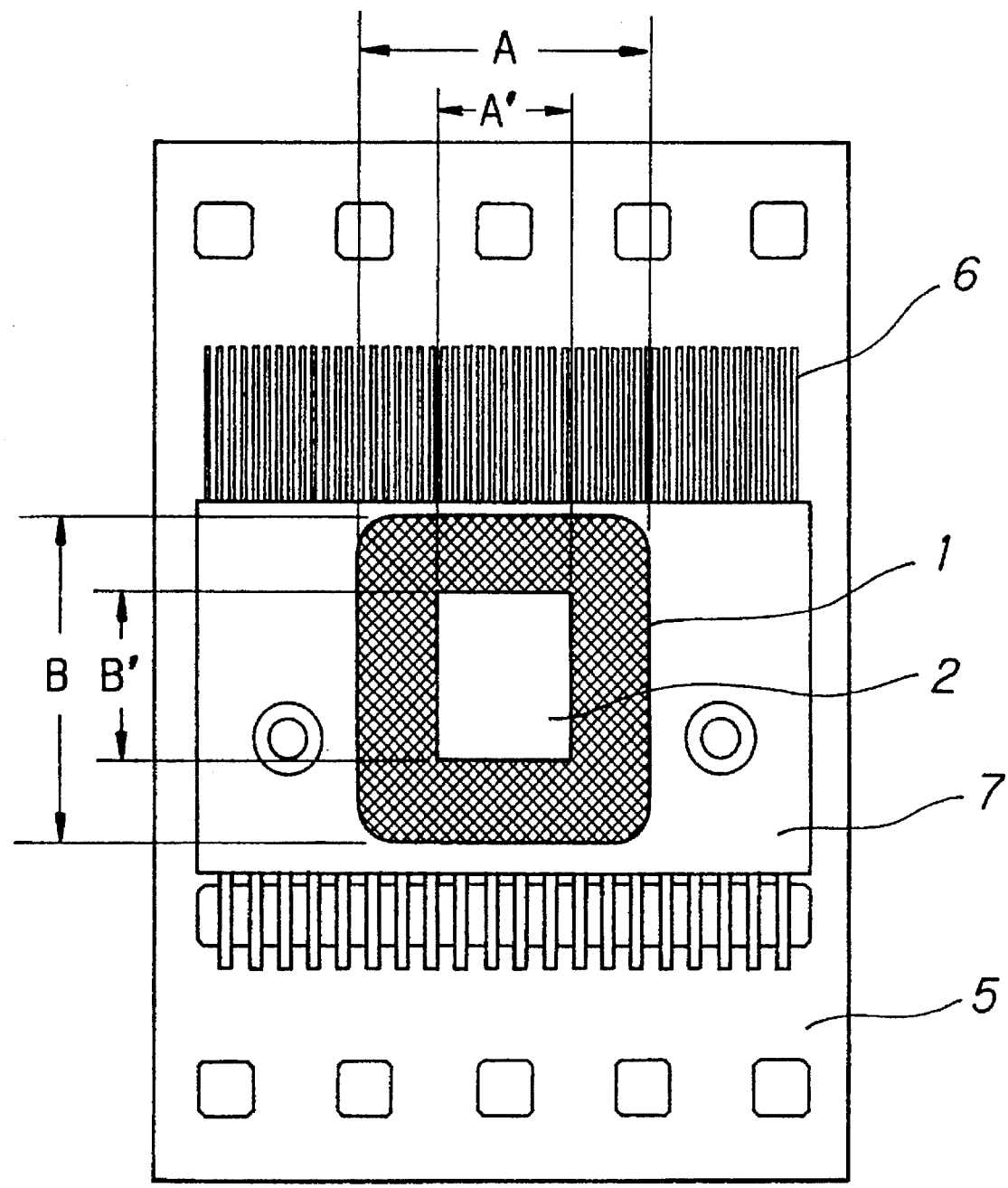
FIG. 3 is a plan view of a conventional type carrier semiconductor device encapsulated with a liquid resin.

FIG. 3 shows the tape carrier semiconductor device of FIG. 2 LSI chip 2 has been encapsulated with a conventional liquid resin having a viscosity of 100–150 cps applied thereto. In FIG. 1 and FIG. 3, like reference numerals indicate like parts for ease of comparison.

In FIG. 3, A and B represent the transverse and the longitudinal dimensions of the resin encapsulated region, respectively. A' and B' represent the transverse and the longitudinal dimensions of LSI chip 2, respectively. Each of (A—A')/2 and (B—B')/2 exceeds 2 mm.

A feature of the present invention is that a particular range of viscosity of the encapsulation resin is used and the relation between the size of the device hole and the size of LSI is defined so as to control the resin encapsulated region.

Figure 4:
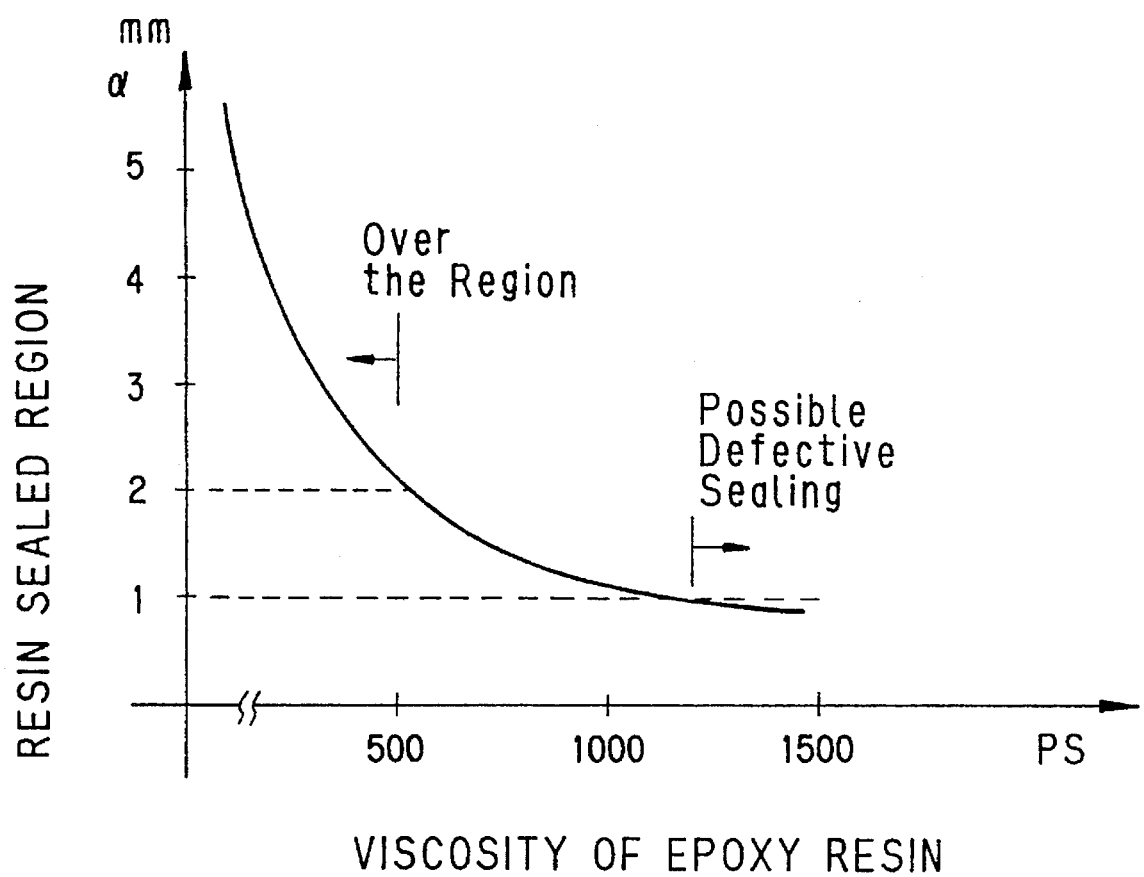
FIG. 4 is a graph showing the relationship between resin viscosity and, resin encapsulated area.

FIG. 4 illustrates a relationship between the viscosity of an epoxy resin and the resin encapsulated region in the case where the device mounting hole size is equal to (chip size+0.2 mm) (i.e. the distance between the inner periphery of the device mounting hole and the outer periphery of the LSI chip being 0.2 mm).

The "α" in FIG. 4 stands for the distance between the outer periphery of the LSI chip and the outer periphery of the resin encapsulated region.

In FIG. 4, the resin viscosity giving the resin encapsulated region which is equal to (chip size+1 to 2 mm) (i.e. a=1 to 2 mm) is 500–1200 ps.

The lower limit of the resin encapsulated region is selected to be (chip size+1 mm) (i.e. α=1 mm) here since defective encapsulation is liable to occur when the resin encapsulated region is less than (chip size+1 mm).

The curve in the graph of FIG. 4 is obtained when the device mounting hole size is equal to (chip size+0.2 mm). However, a curve similar to the curve in FIG. 4 is obtained until the device mounting hole size increases to (chip size +0.3 mm) (i.e. the distance between the inner periphery of the device mounting hole and the outer periphery of the LSI chip).

When the epoxy resin viscosity is higher than the above-mentioned upper limit or the device hole size is larger than the above-mentioned upper limit, the epoxy encapsulation resin can not completely cover the inner leads connecting with an LSI chip or with an LSI chip and a tape carrier pattern, and therefore, the reliability and the mechanical strength are problematic.

On the contrary, when the epoxy resin viscosity is lower than the lower limit, i.e. 500 ps, the resin encapsulated region extends too far.

When the gap between the LSI chip and the device mounting hole is too small, the epoxy resin for encapsulation cannot flow through the gap and thereby, cannot reach the back surface of the LSI chip. Therefore, the reliability is problematic.

As an encapsulation resin, an epoxy resin having a viscosity of 500–1200 ps is used.

Representative epoxy resins are glycidyl ether type epoxy resins. Exemplary suitable epoxy resins are bisphenol A type epoxy resins, bisphenol F type epoxy resins, phenol novolaks type epoxy resins and the like.

Materials which are in contact with the epoxy encapsulation resin are, for example, substrates of the tape carrier. As the substrates, various materials may be used, and are usually resin materials. Exemplary suitable resin materials include polyimide resin films, glass epoxy substrates and polyester resin substrates.

In addition, as other materials in contact with the epoxy encapsulation resin, there may be mentioned a solder resist 7 as shown in FIG. 1.

According to the present invention, the degree of extension of the epoxy encapsulation resin having a viscosity of 500–1200 ps varies somewhat depending upon the kind of the material, but is not so largely affected by the kind of resin material.

The method of encapsulating the LSI chip with the epoxy encapsulation resin is not particularly critical. For example, the epoxy resin having a viscosity of 500–1200 ps may be dropped to the LSI chip.

The procedure for encapsulating the chip may be carried out following prior art procedures, for example, applying the epoxy resin to the chip and allowing it to extend naturally until its flow stops.

For example, an LSI chip of 1.3 mm×14 mm in size was put on a film carrier in a device mounting hole such that the gap between the inner periphery and the outer periphery of the chip was about 0.1 mm. Then about 13 mg of an epoxy resin having a viscosity of about 800 ps was dropped on the chip. The resulting resin encapsulated region was about 3.3 mm×16 mm in size.

It is not always necessary that the gap between the inner periphery of device mounting hole and the outer periphery of a semiconductor chip be the same at every position of the periphery, as long as the gap size is within the range as defined in the present invention. For example, the gap size at a portion where the number of inner leads is smaller is made narrower than the gap size at a portion where the number of inner leads is larger. Such difference in gap size is desired so as to avoid nonuniform flows to the back surface of the chip due to the difference in the number of inner leads overhanging the device mounting hole.

As described above in detail, according to the present invention, the problem of the resin encapsulated region affecting the determination of the outer size of a tape carrier semiconductor device can be solved. As a result, there is produced a subminiature tape carrier semiconductor device of which resin sealed region is within an area formed by extending the periphery of the semiconductor chip to the outside by 2 mm.

For example, the present invention is particularly effective to decrease the resin encapsulated area in a liquid crystal driver so as to lessen the outer periphery of portions other than the display portion.

FIGS. 5A, 5B, 7 and 8 illustrate further embodiments of tape carrier semiconductor devices and carrier tapes for semiconductor devices according to the present invention.

Figure 5A:
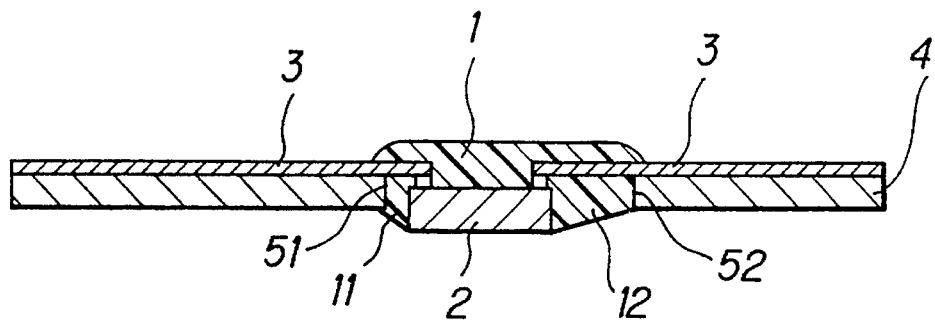
FIG. 5A is a cross section of a tape carrier package according to another embodiment of the present invention.
Figure 5B:
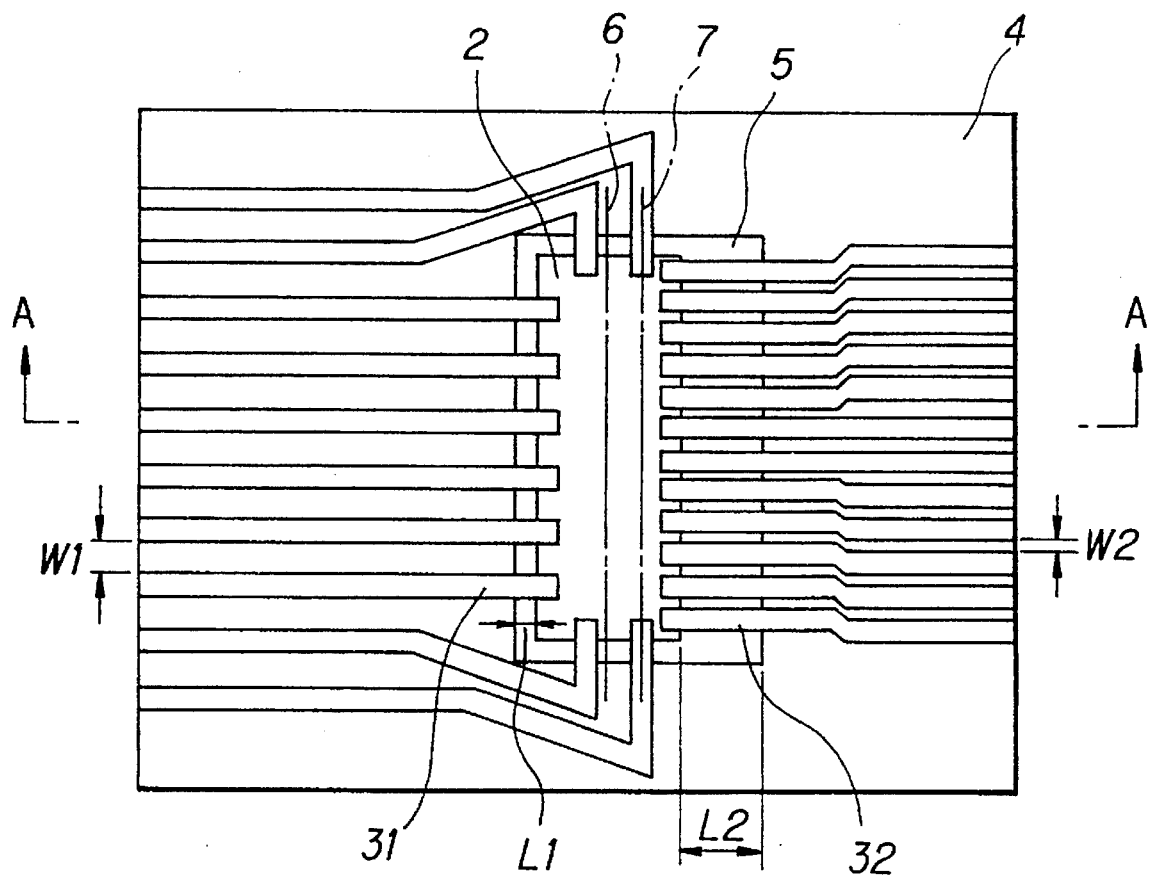
FIG. 5B is a plan view of the tape carrier package of FIG. 5A without an encapsulation resin.
Figure 6A:
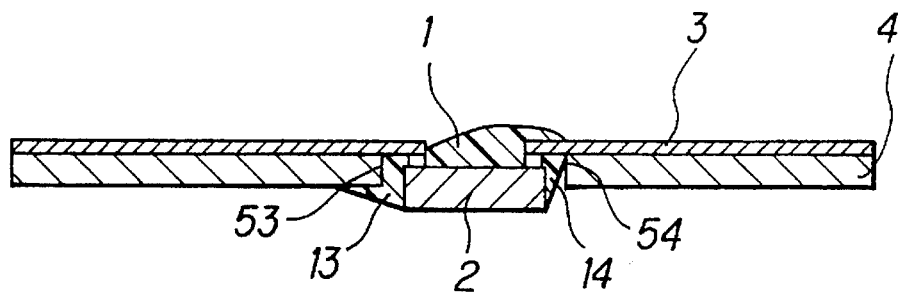
FIG. 6A is a cross section of a conventional tape carrier package.
Figure 6B:
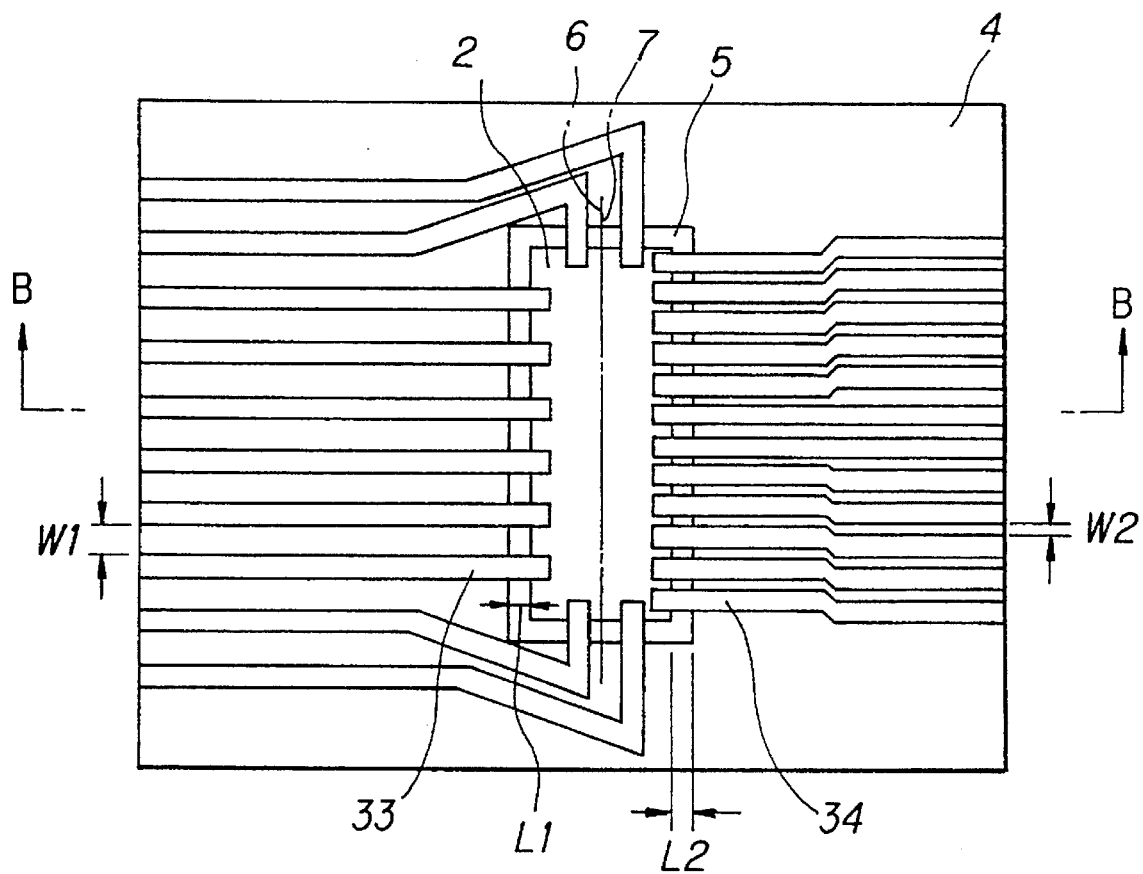
FIG. 6B is a plan view of the tape carrier package of FIG. 6A without an encapsulation resin.

FIG. 5A is a cross section showing a state after encapsulating with a resin. FIG. 5B is a plan view showing a state before encapsulating with a resin. FIG. 5A is a cross sectional view of FIG. 5B taken along line A—A.

In FIG. 5A and FIG. 5B a semiconductor chip 2 is mounted in a device mounting hole 5 (FIG. 5B) provided in a tape carrier 4.

In the above-mentioned semiconductor device, the resin encapsulation is usually carried out by dropping or applying a softened encapsulation resin (such as epoxy resins, silicone resins, polyimide resins and the like) to a front surface side of semiconductor chip 2. The resin is thereby supplied to a device mounting hole at the side surface of semiconductor chip 2 through a region contributing to the outflow of resin. The outflow region is defined by the gap length of the device mounting hole and the lead gap widths. The flowability and viscosity of encapsulation resin allow the resin to cover the surface of semiconductor chip 2 and filling the whole device mounting hole 5.

Encapsulation resin 1 becomes a surface protective film for protecting the surface of the semiconductor chip 2. On the other hand, encapsulation resin 11 and 12 fills the device mounting hole 5 to suppress adverse influences coming from the rear surface and the side surface of semiconductor chip 2 and, in addition, maintains mechanical strength.

First edge side inner leads 31 extending from the first edge 51 of device mounting hole 5 to semiconductor chip 2 are arranged relatively sparsely, i.e. the gap width (W) is large (W=$W_1$). In contrast, second edge side inner leads 32 extending from the second edge 52 opposite to first edge 51 to semiconductor chip 2 are arranged relatively densely, i.e. the gap width (W) is small (W=$W_2$).

For simplification, the inner leads 31 at the first edge side are uniformly arranged, and the inner leads 32 at the second edge side are also uniformly arranged, but such uniform arrangement of leads is not always necessary.

In order to mount semiconductor chip 2 such that center line 6 of semiconductor chip 2 is located nearer to the first edge 51 of device mounting hole 5 than center line 7 of device mounting hole 5. The length of inner lead 31 at the first edge side is shorter than the length of inner lead 32 at the second edge side.

Consequently, the gap length of device mounting hole (L) formed when semiconductor chip 2 is mounted is shorter at the first edge side 51 of device mounting hole 5 (L=$L_1$:gap length of device mounting hole at the first edge side) than at the second edge side 52 of device mounting hole 5 (L=$L_2$:gap length of device mounting hole at the second edge side).

The total area (S) of regions contributing to outflow of resin at each edge of device mounting hole is represented by S=W×L×N where W is a gap width of leads, L is a gap length of the device mounting hole, and N is a number of the gap width of leads.

For simplification, the portion where edges contact is excluded. In this example, the total areas of regions contributing to outflow of resin at edges of the device mounting hole located opposite to each other are the same.

At the first edge (51) side of device mounting hole 5, when the gap length of device mounting hole $L_1$ at the first edge side is 0.2 mm, the lead gap width $W_1$ of inner leads 31 at the first edge side is 3.0 mm, and the number of lead gaps $N_1$ is 5, the total area $S_1$ of the regions contributing to outflow of resin at the first edge side is $S_1=L_1 \times W_1 \times N_1=0.2 \times 3.0 \times 5=3.0$ mm².

At the second edge (52) side of device mounting hole 5, when the lead gap width $W_2$ of inner leads 32 at the second edge side is 0.5 mm, the number of lead gaps $N_2$ is 11, and the total area $S_1$ of the regions contributing to outflow of resin at the first edge side is the same as the total area $S_2$ of the regions contributing to outflow of resin at the second edge side, the gap length of the device mounting hole $L_2$ at the second edge side is to be $L_2=S_2/(W_2 \times N_2)= S_1/(W_2 \times N_2)=3.0/(0.5 \times 11)=0.55$ mm.

In view of the foregoing, the flow of the encapsulation resin can be substantially uniform by making the total area of the regions contributing to the outflow of the resin at the first edge side of the device mounting hole the same as that at the second edge side. Therefore, the thickness of the encapsulation resin 1 on the surface of semiconductor chip 2 can be made substantially uniform over the whole surface encapsulated portion, and moreover, the device mounting hole at the side surface of the semiconductor chip can be uniformly filled with the encapsulation resin. As a result, the non-uniformity of the conventional encapsulating technique is avoided.

In the above example, the ratio of total areas of regions contributing to outflow of resin is 1.0, but it is not always necessary that the both total areas be the same. For example, even when $S_2/S_1$=about 0.7–1.3, a result similar to that as above and better than conventional encapsulating technique can be obtained. This appears to be due to the fact that the encapsulation resin is in a liquid state when dropped or applied to the device mounting hole portion and has a predetermined fluidity and viscosity. Therefore, as far as a predetermined amount of the resin is supplied from the front surface to the rear surface of the semiconductor chip, the encapsulation resin sufficiently spreads along the device mounting hole to fill the hole sufficiently.

Figure 7:
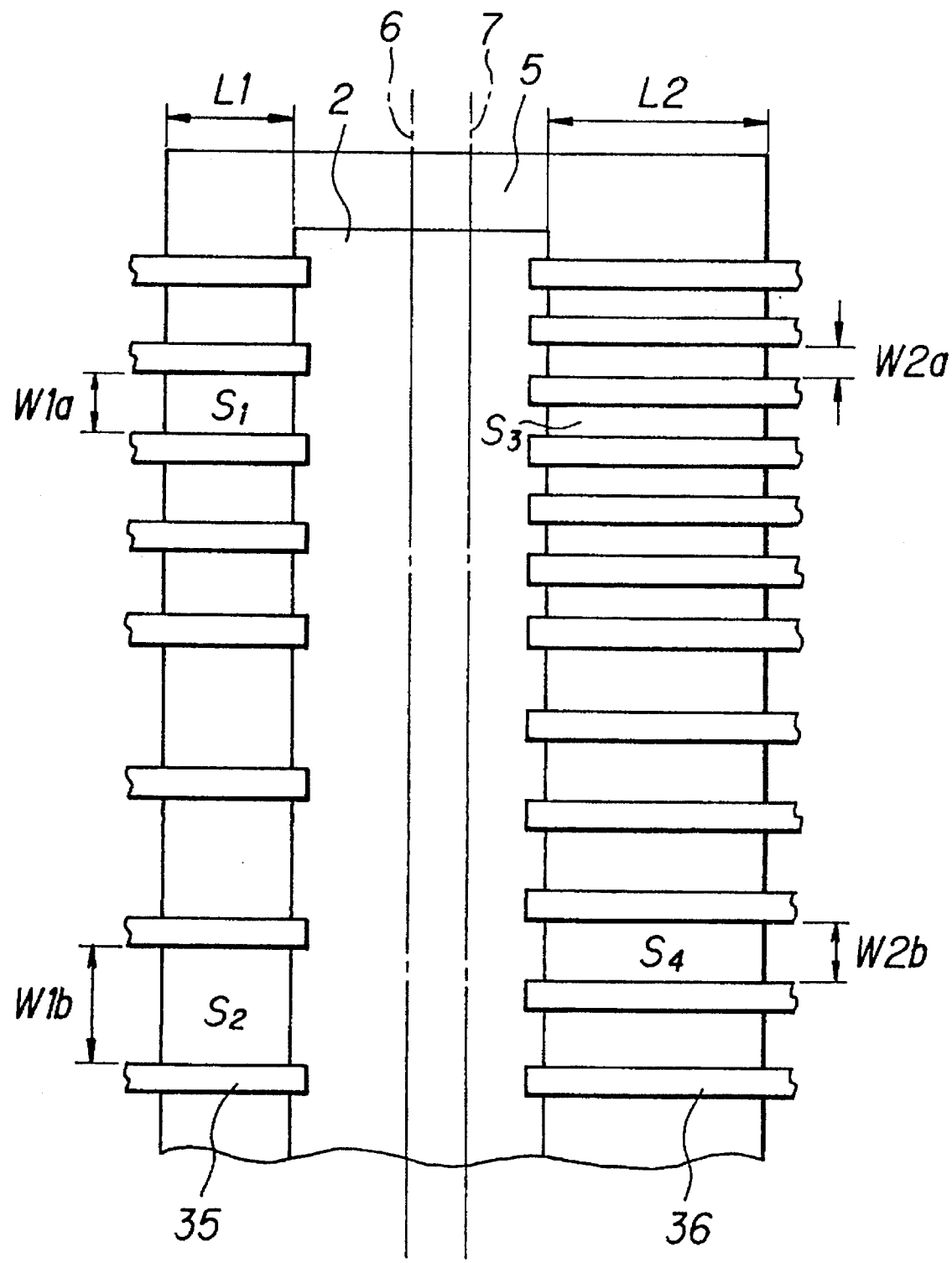
FIG. 7 is a plan view of a tape carrier package according to another embodiment of the present invention.

FIG. 7 shows a TCP semiconductor device where the pap widths, $W_{1a}$ and $W_{1b}$, of inner leads 35 at the first edge side (which are ununiformly connected with the first edge side of semiconductor chip 2 mounted inside a device mounting hole 5 of a carrier tape) are larger than the respective gap widths, $W_{2a}$ and $W_{2b}$, of inner leads 36 at the second edge side (which are ununiformly connected with the second edge side of semiconductor chip 2 opposite to the first edge side).

The area of a region contributing to outflow of resin at the first edge side of a semiconductor chip $S_1$ is defined by a gap length of device mounting hole $L_1$ and a gap width $W_{1a}$ between inner leads, and that at the first edge side $S_2$ is defined by $L_1$ and a gap width $W_{1b}$ between inner leads.

The total of said areas of $S_1$ and $S_2$ at the optional portion at the first edge side of semiconductor chip 2 as illustrated in FIG.7 is represented by [(4×$S_1$)+(3×$S_2$)]. With respect to the second edge side opposite to the above-mentioned first edge side of the semiconductor chip, the area of a region contributing to the outflow of the resin at the second edge side of a semiconductor chip $S_3$ is defined by a gap length of device mounting hole $L_2$ and a gap width $W_{2a}$ between inner leads, and that at the second edge side $S_4$ is defined by $L_2$ and a gap width $W_{2b}$ between inner leads.

The total of the areas of $S_3$ and $S_4$ at the second edge side of semiconductor chip 2 as illustrated in FIG. 7 is represented by [(6×$S_3$)+(5×$S_4$)].

In FIG. 7, both totals of the areas are made the same. That is, the total area of regions contributing to outflow of a sealing resin at the first edge side of the semiconductor chip per unit length along the edge is made equal to that at the second edge side of the semiconductor chip per unit length along the edge.

Figure 8:
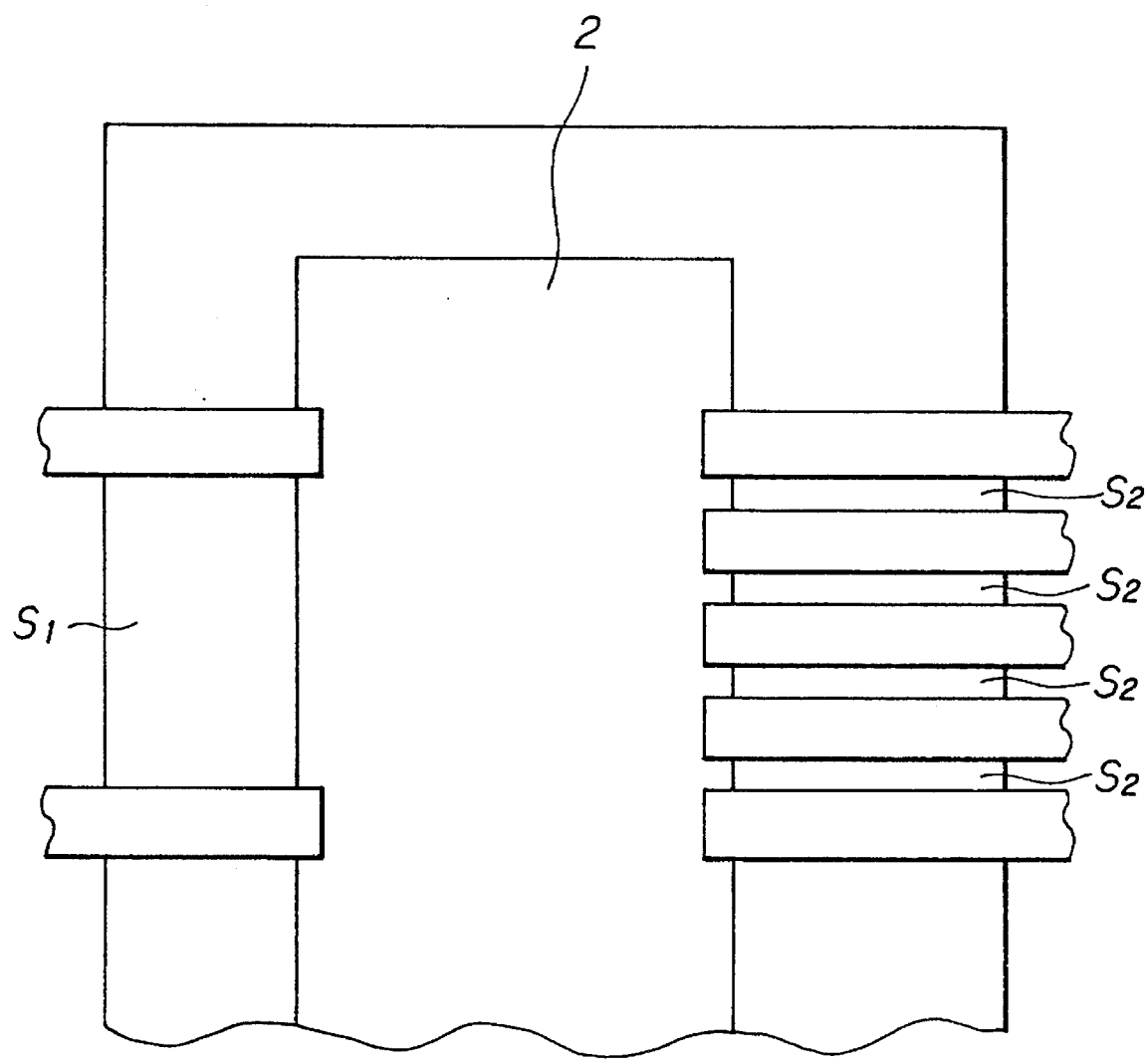
FIG. 8 is a diagrammatic view showing the relation of an arrangement of inner leads and regions contributing to outflow of resin according to the present invention.

FIG. 8 shows an arrangement of inner leads and the region contributing to the outflow of resin (area) according to the present invention. In particular, FIG. 8 illustrates a case where area $S_1$ of one region (contributing to the outflow of resin at the first edge side) is the same as the total of four regions contributing to outflow of resin at the second edge side, $4 \times S_2$.

In FIG. 8, it is also possible to make the degree of resin flow at the first edge side equal to that at the second edge side with respect to the two opposite edge sides of semiconductor chip 2. Therefore, the encapsulation resin can uniformly cover the front surface of the semiconductor chip and fill the device mounting hole.

With respect to the characteristics of the resin, the viscosity is 10 poises or more, and a non-Newtonian fluid is effective.

Although the curing temperature varies depending on resins, the curing is effectively carried out at a high temperature such as 150°–200° C. for a short time (several to 10 min.) as compared with at a low temperature such as 80° C.

Thus, according to certain aspects of the present invention, the tape carrier semiconductor device is preferably such that the gap width between inner leads connected with a first edge side of a semiconductor chip (set within a device mounting hole provided in the tape carrier) is larger than the gap width between leads connected with a second edge side (opposite to the first edge side) of the semiconductor chip. The gap length of the device mounting hole between the first edge of the semiconductor chip and the first edge of the device mounting hole (corresponding to the first edge of the semiconductor chip) is smaller than the gap length between the second edge of the semiconductor chip and the second edge of the device mounting hole (corresponding to the second edge of the semiconductor chip).

The above-mentioned tape carrier semiconductor device may be such that the gap width between inner leads connected with a first edge side of a semiconductor chip set (within a device mounting hole provided in the tape carrier) is larger than the gap width between leads connected with a second edge side (opposite to the first edge side) of the semiconductor chip. The total area of regions contributing to the outflow of the encapsulation resin defined by the gap length of the device mounting hole and the gap width between inner leads at the first edge side is substantially the same as that of regions contributing to the outflow of the encapsulation resin defined by the gap length of the device mounting hole and the gap width between inner leads at the second edge side.

Further, the area of one region contributing to the outflow of the encapsulation resin defined by the gap length of the device mounting hole and the gap width between inner leads at the first edge side of the semiconductor chip may be substantially the same as the total area of regions contributing to the outflow of the encapsulation resin at the second edge side of the semiconductor chip. The regions at the second edge side correspond to the one region at the first edge side. Alternatively, the total area of regions contributing to the outflow of the encapsulation resin at the first edge side of the semiconductor chip per unit length of the edge may be substantially the same as the total area of regions contributing to the outflow of the encapsulation resin at the second edge side of the semiconductor chip per unit length of the edge.

Another aspect of the present invention may alternatively include the tape carrier semiconductor device such that the gap width between inner leads connected with a first edge side of a semiconductor chip set within a device mounting hole provided in the tape carrier is larger than the gap width between leads connected with a second edge side opposite to the first edge side of the semiconductor chip. A center line between the first edge and the second edge of the semiconductor chip is located nearer to the first edge of the device mounting hole (corresponding to the first edge of the semiconductor chip) than a center line between the first edge and the second edge of the device mounting hole, so as to make the gap length at the first edge side different from that at the second edge side. This alternative form of the tape carrier semiconductor device may be also used in the above-mentioned embodiments.

According to further aspect of the present invention, the semiconductor device of a tape carrier package type is preferably such that the gap width between inner leads connected with a first edge side of a semiconductor chip set within a device mounting hole provided in the tape carrier is larger than the gap width between leads connected with a second edge side opposite to the first edge side of the semiconductor chip. The total area of regions contributing to outflow of the encapsulation resin defined by the gap length of the device mounting hole and the gap width between inner leads at the first edge side is substantially the same as that of regions contributing to outflow of the encapsulation resin defined by the gap length of the device mounting hole and the gap width between inner leads at the second edge side.

In the above-mentioned semiconductor device of a tape carrier package type; the area of one region contributing to outflow of the encapsulation resin defined by the gap length of device mounting hole and the gap width between inner leads at the first edge side of the semiconductor chip may be substantially the same as the total area of regions contributing to outflow of the encapsulation resin at the second edge side of the semiconductor chip, and said regions at the second edge side are correspondent to said one region at the first edge side. Alternatively, the total area of regions contributing to outflow of the encapsulation resin at the first edge side of the semiconductor chip per unit length of the edge may be substantially the same as the total area of regions contributing to outflow of the encapsulation resin at the second edge side of the semiconductor chip per unit length of the edge.

This further aspect of the present invention may alternatively include a semiconductor device of a tape carrier package type in which the gap width between inner leads connected with a first edge side of a semiconductor chip set within a device mounting hole provided in the tape carrier is larger than the gap width between leads connected with a second edge side opposite to the first edge side of the semiconductor chip. A center line between the first edge and the second edge of the semiconductor chip is located nearer to the first edge of the device mounting hole (corresponding to the first edge of the semiconductor chip) than a center line between the first edge and the second edge of the device mounting hole, so as to make the gap length at the first edge side different from that at the second edge side. This alternative form of the semiconductor device of a tape carrier package type may also used in the above-mentioned embodiments.

According to yet another aspect of the present invention, the carrier tape for a semiconductor device of a tape carrier package type is preferably such that the gap width between inner leads at the first edge side extending from the first edge of a device mounting hole for setting a semiconductor chip to the first edge of the semiconductor chip is larger than the gap width between inner leads at the second edge side extending from the second edge of the device mounting hole opposite to the first edge to the second edge of the semiconductor chip, and the total area of the regions contributing to outflow of an encapsulation resin defined by the gap width between inner leads at the first edge side and a gap length of device mounting hole at the first edge side between the first edge of the device mounting hole and the first edge of the semiconductor chip is substantially the same as the total area of the regions contributing to outflow of an encapsulation resin defined by the gap width between inner leads at the second edge side and a gap length of device mounting hole at the second edge side between the second edge of the device mounting hole and the second edge of the semiconductor chip.

In the above-mentioned carrier tape, the area of one region contributing to outflow of the encapsulation resin defined by the gap length of device mounting hole and the gap width between inner leads at the first edge side of the semiconductor chip may be substantially the same as the total area of regions contributing to outflow of the encapsulation resin at the second edge side of the semiconductor chip, and the regions at the second edge side are correspondent to said one region at the first edge side. Alternatively, the total area of regions contributing to outflow of the encapsulation resin at the first edge side of the semiconductor chip per unit length of the edge may be substantially the same as the total area of regions contributing to outflow of the encapsulation resin at the second edge side of the semiconductor chip per unit length of the edge.

According to still another aspect of the present invention, a semiconductor device of a tape carrier package type may be manufactured by carrying out:

a step for forming inner leads at a first edge side and inner leads at a second edge side extending to a device mounting hole portion such that the total area of regions contributing to outflow of the encapsulation resin at the first edge side (formed between the first edge of the device mounting hole of the carrier tape and the first edge of a semiconductor chip) is substantially the same as the total area of regions contributing to outflow of the encapsulation resin at the second edge side (formed between the second edge of the device mounting hole of the carrier tape [opposite to the first edge thereof] and the second edge of the semiconductor chip), a step for connecting electrodes at a first surface of a semiconductor chip with the ends of inner leads at the first edge side and the ends of inner leads at the second edge side, and a step for encapsulating the semiconductor chip with a resin by supplying an encapsulation resin to the side surface of the carrier tape from the first surface side of the carrier tape through the regions contributing to outflow of the encapsulation resin at the first edge side and the second edge side.

In the above-mentioned aspects, when the resin flows from the front surface of the semiconductor chip to the side surface of the semiconductor chip, the gap area defined by the edge of the device mounting hole, inner leads and the chip edge is considered as a main factor affecting the flowing amount of the resin.

According to the present invention, the amounts of the resin flowing to the rear side of the tape carrier through the device mounting hole at the first edge side and the second edge side can be made uniform by controlling the gap area such that the resin amount supplied from the resin supplying surface(the front side of the semiconductor chip) to the side surface of the semiconductor chip at the first edge side of the device mounting hole where the electrode arrangement formed on the semiconductor chip is sparse is equal to that at the second edge side of the device mounting hole where the electrode arrangement formed on the semiconductor chip is dense.

As a result of equal flow of the encapsulation resin, the thickness of the encapsulation resin covering the front surface of the semiconductor chip is substantially the same.

Further, it is possible to provide a TCP (tape carrier package) semiconductor device encapsulated with an encapsulation resin resulting in a shape of a designed dimension.

According to the present invention, numerous advantages can be attained. For example, the amount of resin for protecting a semiconductor device is uniformly applied in each direction of the semiconductor device. This solves prior art problems such as local exposure of lead pattern and poor appearance (e.g. the thickness of resin applied to one edge portion being markedly larger than that applied to other edge portions). Since the resin can equally flow, a uniform resin thickness can be attained and thereby, anti-crack and anti-humidity properties are improved. Moreover, an equal amount of resin can be applied to each edge of the semiconductor chip. As a result, it is not necessary to control the coating pressure and optimize the drawing speed, thereby shortening the processing time.

In addition, prior art problems such as unnecessary exposure of conductor patterns (due to ununiform flow of the encapsulation resin) and poor encapsulation (due to partial excess flow of the encapsulation resin) are solved. Advantageously, since the amount of resin for protecting a semiconductor device becomes uniform, anti-humidity properties and resistance to thermal stress are also uniform. Further inspection time is decreased and labor for treatment is reduced.

What is claimed is:

1. A tape carrier semiconductor device comprising:

a semiconductor chip;

a tape carrier having a device mounting hole therein that is larger in size than said chip and patterns of inner leads for forming connections with said chip;

the chip being disposed within said hole to produce gap areas defined by edges of the device mounting hole, inner leads and chip edges;

a cured epoxy encapsulating resin filling the gap areas between said chip and said hole and extending beyond the edges of said chip onto said tape carrier;

wherein said chip has a differing number of lead connections per unit distance along respective different edges of the chip and wherein a gap length between the chip and the hole along the chip edges is directly related to the number of lead connections thereat so as to obtain a substantially uniformly encapsulated semiconductor device.

2. The tape carrier semiconductor device of claim 1 in which a gap width between inner leads connected with a first edge of a semiconductor chip set within the device mounting hole provided in the tape carrier is larger than a gap width between leads connected with a second edge opposite to the first edge side of the semiconductor chip, and a gap length of the device mounting hole between the first edge of the semiconductor chip and a first edge of the device mounting hole corresponding to the first edge of the semiconductor chip is smaller than a gap length between the second edge of the semiconductor chip and a second edge of the device mounting hole .corresponding to the second edge of the semiconductor chip.

3. The tape carrier semiconductor device of claim 1 in which a gap width between inner leads connected with a first edge of the semiconductor chip set within the device mounting hole is larger than a gap width between leads connected with a second edge of the semiconductor chip, the second edge of the semiconductor chip being opposite to the first edge of the semiconductor chip, and a center line between a first edge and the second edge of the semiconductor chip is located nearer to a first edge of the device mounting hole corresponding to the first edge of the semiconductor chip than to a center line between the first edge and the second edge of the device mounting hole, so as to make a gap length at the first edge side different from that at a second edge side.

4. The tape carrier semiconductor device of claim 1 in which a gap width between inner leads connected with a first edge of a semiconductor chip set within the device mounting hole is larger than a gap width between leads connected with a second edge of the semiconductor chip, the second edge of the semiconductor chip being opposite to the first edge of the semiconductor chip, and a total area of regions contributing to outflow of the encapsulation resin defined by a gap length of the device mounting hole and a gap width between inner leads at the first edge being substantially the same as that of regions contributing to outflow of the encapsulation resin defined by a gap length of the device mounting hole and a gap width between inner leads at the second edge.

5. The tape carrier semiconductor device according to claim 4 in which the area of one region contributing to outflow of the encapsulation resin defined by the gap length of device mounting hole and the gap width between inner leads at the first edge of the semiconductor chip is substantially the same as the total area of regions contributing to outflow of the encapsulation resin at the second edge of the semiconductor chip, said regions at the second edge corresponding to said one region at the first edge.

6. The tape carrier semiconductor device according to claim 4 in which the total area of regions contributing to outflow of the encapsulation resin at the first edge of the semiconductor chip per unit length of the edge is substantially the same as the total area of regions contributing to outflow of the encapsulation resin at the second edge of the semiconductor chip per unit length of the edge.

7. A tape carrier semiconductor device comprising:

a tape carrier including a semiconductor chip disposed within a hole in the carrier and having gap areas between edges of the chip and edges of the hole, which are filled with a cured epoxy resin that extends beyond the edges of said chip;

wherein said chip includes a different number of leads connected at respective different edges of the chip and wherein a dimension of the gap areas varies between the chip edges and the hole edges as a function of the number of lead connections made thereto.

8. The tape carrier semiconductor device of claim 7 in which a gap width between inner leads connected with a first edge of a semiconductor chip set within the device mounting hole provided in the tape carrier is larger than a gap width between leads connected with a second edge opposite to the first edge side of the semiconductor chip, and a gap length of the device mounting hole between the first edge of the semiconductor chip and a first edge of the device mounting hole corresponding to the first edge of the semiconductor chip is smaller than a gap length between the second edge of the semiconductor chip and a second edge of the device mounting hole corresponding to the second edge of the semiconductor chip.

9. The tape carrier semiconductor device of claim 7 in which a gap width between inner leads connected with a first edge of the semiconductor chip set within the device mounting hole is larger than a gap width between leads connected with a second edge of the semiconductor chip, the second edge of the semiconductor chip being opposite to the first edge of the semiconductor chip, and a center line between the first edge and the second edge of the semiconductor chip is located nearer to a first edge of the device mounting hole corresponding to the first edge of the semiconductor chip than to a center line between the first edge and the second edge of the device mounting hole so as to make a gap length at the first edge different from that at a second edge side.

10. The tape carrier semiconductor device of claim 7 in which a gap width between inner leads connected with a first edge of a semiconductor chip set within the device mounting hole is larger than a gap width between leads connected with a second edge of the semiconductor chip, the second edge of the semiconductor chip being opposite to the first edge of the semiconductor chip, and a total area of regions contributing to outflow of the encapsulation resin defined by a gap length of the device mounting hole and a gap width between inner leads at the first edge being substantially the same as that of regions contributing to outflow of the encapsulation resin defined by a gap length of the device mounting hole and a gap width between inner leads at the second edge.

11. The tape carrier semiconductor device according to claim 10 in which the area of one region contributing to outflow of the encapsulation resin defined by the gap length of device mounting hole and the gap width between inner leads at the first edge of the semiconductor chip is substantially the same as the total area of regions contributing to outflow of the encapsulation resin at the second edge of the semiconductor chip, said regions at the second edge corresponding to said one region at the first edge side.

12. The tape carrier semiconductor device according to claim 10 in which the total area of regions contributing to outflow of the encapsulation resin at the first edge of the semiconductor chip per unit length of the edge is substantially the same as the total area of regions contributing to outflow of the encapsulation resin at the second edge of the semiconductor chip per unit length of the edge.

13. A semiconductor device of a tape carrier package type in which a gap width between inner leads connected with a first edge of a semiconductor chip set within a device mounting hole provided in the tape carrier is larger than a gap width between leads connected with a second edge opposite to the first edge of the semiconductor chip, and a gap length of the device mounting hole between the first edge of the semiconductor chip and a first edge of the device mounting hole corresponding to the first edge of the semiconductor chip is smaller than a gap length between the second edge of the semiconductor chip and a second edge of the device mounting hole corresponding to the second edge of the semiconductor chip.

14. A semiconductor device of a tape carrier package type in which a gap width between inner leads connected with a first edge of a semiconductor chip set within a device mounting hole provided in the tape carrier is larger than a gap width between leads connected with a second edge of the semiconductor chip, the second edge of the semiconductor chip being opposite to the first edge of the semiconductor chip, and a center line between the first edge and the second edge of the semiconductor chip is located nearer to a first edge of the device mounting hole corresponding to the first edge of the semiconductor chip than to a center line between the first edge and the second edge of the device mounting hole, so as to make a gap length at the first edge different from that at a second edge side.

15. A semiconductor device of a tape carrier package type in which a gap width between inner leads connected with a first edge of a semiconductor chip set within a device mounting hole provided in the tape carrier is larger than a gap width between leads connected with a second edge of the semiconductor chip, the second edge Of the semiconductor chip being opposite to the first edge of the semiconductor chip, and a total area of regions contributing to outflow of an encapsulation resin defined by the gap length of the device mounting hole and the gap width between inner leads at the first edge is substantially the same as that of regions contributing to outflow of the encapsulation resin defined by the gap length of the device mounting hole and the gap width between inner leads at the second edge.

16. The semiconductor device of a tape carrier package type according to claim 13, 14 or 15 in which the area of one region contributing to outflow of the encapsulation resin defined by the gap length of device mounting hole and the gap width between inner leads at the first edge of the semiconductor chip is substantially the same as the total area of regions contributing to outflow of the encapsulation resin at the second edge of the semiconductor chip, said regions at the second edge being correspondent to said one region at the first edge.

17. The semiconductor device of a tape carrier package type according to claim 13, 14 or 15 in which the total area of regions contributing to outflow of the encapsulation resin at the first edge of the semiconductor chip per unit length of the edge is substantially the same as the total area of regions contributing to outflow of the encapsulation resin at the second edge of the semiconductor chip per unit length of the edge.

18. A carrier tape for a semiconductor device of a tape carrier package type in which a gap width between inner leads extending from a first edge of a device mounting hole for the semiconductor chip is larger than a gap width between inner leads extending from a second edge of the device mounting hole opposite to the first edge of the semiconductor chip, and a length of the inner lead at the first edge is shorter than that of the inner lead at the second edge.

* * * * *